(12) United States Patent
Lee et al.

(10) Patent No.: US 9,496,248 B2
(45) Date of Patent: Nov. 15, 2016

(54) INTERPOSER FOR INTEGRATED CIRCUIT CHIP PACKAGE

(71) Applicant: FUJITSU LIMITED, Kawasaki-shi, Kanagawa (JP)

(72) Inventors: Michael Lee, Saratoga, CA (US); Takuji Yamamoto, San Jose, CA (US)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/148,557

(22) Filed: Jan. 6, 2014

(65) Prior Publication Data

US 2015/0194413 A1    Jul. 9, 2015

(51) Int. Cl.
| | |
|---|---|
| H01L 25/18 | (2006.01) |
| H01L 25/065 | (2006.01) |
| H01L 25/00 | (2006.01) |
| H01L 23/473 | (2006.01) |
| H01L 23/00 | (2006.01) |
| H01L 23/498 | (2006.01) |
| H01L 21/48 | (2006.01) |
| H01L 23/13 | (2006.01) |
| G02B 6/42 | (2006.01) |

(52) U.S. Cl.
CPC ............. *H01L 25/18* (2013.01); *G02B 6/4268* (2013.01); *G02B 6/4274* (2013.01); *H01L 23/473* (2013.01); *H01L 25/0655* (2013.01); *H01L 25/50* (2013.01); *G02B 6/4249* (2013.01); *H01L 23/13* (2013.01); *H01L 23/49827* (2013.01); *H01L 24/13* (2013.01); *H01L 24/16* (2013.01); *H01L 2224/131* (2013.01); *H01L 2224/16235* (2013.01); *H01L 2224/73253* (2013.01); *H01L 2924/00015* (2013.01); *H01L 2924/14* (2013.01); *H01L 2924/1432* (2013.01); *H01L 2924/15153* (2013.01); *H01L 2924/15311* (2013.01)

(58) Field of Classification Search
CPC .................. H01L 25/18; H01L 25/068; H01L 25/00; H01L 23/473; H01L 23/00; H01L 23/498; H01L 21/48
USPC ............... 257/692, 698, 700, 723, 774, 778; 438/584
See application file for complete search history.

(56) References Cited

U.S. PATENT DOCUMENTS 4,891,762 A * 1/1990 Chotiros ................. 701/514
4,967,260 A * 10/1990 Butt ......................... 257/668
(Continued)

OTHER PUBLICATIONS

Zheng, X., Liu, et al. (Feb. 15, 2012). Ultralow power 80 Gb/s arrayed CMOS silicon photonic transceivers for WDM optical links. Lightwave Technology, Journal of, 30(4), 641-650. Feb. 15, 2012.

*Primary Examiner* — Sheng Zhu
(74) *Attorney, Agent, or Firm* — Maschoff Brennan (57) ABSTRACT

An interposer for an electronic circuit chip package may include a substrate, a recess, first conductive vias, and second conductive vias. The substrate may have a first surface, a second surface substantially parallel to and opposite the first surface, a third surface substantially parallel to the first surface and the second surface, and an orthogonal surface that is substantially orthogonal to and intersects the first surface and the third surface. The recess may be formed in the substrate and defined by the third surface and the orthogonal surface. The first conductive vias may pass from the second surface to the first surface. The second conductive vias may pass from the second surface to the third surface.

12 Claims, 7 Drawing Sheets

(56) References Cited

U.S. PATENT DOCUMENTS

| | | | |
|---|---|---|---|
| 5,199,165 A * | 4/1993 | Crawford et al. | 29/846 |
| 5,939,782 A * | 8/1999 | Malladi | 257/698 |
| 6,285,559 B1 * | 9/2001 | Fukiharu | 361/760 |
| 6,555,756 B2 * | 4/2003 | Nakamura et al. | 174/255 |
| 6,686,653 B2 * | 2/2004 | Jerominek et al. | 257/680 |
| 6,774,366 B1 * | 8/2004 | Friedman et al. | 250/328 |
| 6,879,488 B2 * | 4/2005 | Takeda et al. | 361/704 |
| 7,050,304 B2 * | 5/2006 | Hsu et al. | 361/719 |
| 7,139,448 B2 | 11/2006 | Jain et al. | |
| 7,889,956 B2 | 2/2011 | Beausoleil et al. | |
| 2006/0239612 A1 | 10/2006 | De Dobbelaere et al. | |
| 2009/0011547 A1 * | 1/2009 | Lu et al. | 438/122 |
| 2014/0015119 A1 * | 1/2014 | Bonkohara | 257/713 |

\* cited by examiner

INTERPOSER FOR INTEGRATED CIRCUIT CHIP PACKAGE

FIELD

The embodiments discussed herein are related to an interposer for an integrated circuit (IC) chip package.

BACKGROUND

Chip-to-chip interconnects are used to electrically interconnect heterogeneous components in environments including IC chip packages. Chip-to-chip interconnects in some IC chip packages may be relatively long and the length of the chip-to-chip interconnects may adversely impact and/or prevent high bandwidth data communications over the chip-to-chip interconnects between interconnected chips.

Other IC chip packages may have relatively short chip-to-chip interconnects at the expense of relatively high thermal coupling between the chips. Where the performance of one of the interconnected chips is temperature-sensitive and the other of the interconnected chips is subject to temperature fluctuations, the relatively high thermal coupling between the chips and the temperature fluctuations may adversely affect the performance of the temperature-sensitive chip.

The subject matter claimed herein is not limited to embodiments that solve any disadvantages or that operate only in environments such as those described above. Rather, this background is only provided to illustrate one example technology area where some embodiments described herein may be practiced.

SUMMARY

According to an aspect of an embodiment, an interposer for an electronic circuit chip package may include a substrate, a recess, first conductive vias, and second conductive vias. The substrate may have a first surface, a second surface substantially parallel to and opposite the first surface, a third surface substantially parallel to the first surface and the second surface, and an orthogonal surface that is substantially orthogonal to and intersects the first surface and the third surface. The recess may be formed in the substrate and may be defined by the third surface and the orthogonal surface. The first conductive vias may pass from the second surface to the first surface. The second conductive vias may pass from the second surface to the third surface.

The object and advantages of the embodiments will be realized and achieved at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which.

DESCRIPTION OF EMBODIMENTS

Some embodiments described herein may relate to an interposer for an integrated circuit (IC) chip package. An IC chip package is an example of an electronic chip package. The interposer may have a first chip mounted on a first side of the interposer. A second side opposite the first side may be coupled to a package substrate and may include a recess formed therein. A second chip may be mounted to the interposer within the recess. Chip-to-chip interconnects between the first chip and the second chip may be relatively shorter than in some IC chip packages, which may result in a relative performance improvement in applications involving high bandwidth data communications between the first chip and the second chip. Alternately or additionally, thermal resistance between the first chip and the second chip may be relatively greater than in some IC chip packages, which may reduce an adverse effect of heat transfer from the first chip to the second chip with respect to performance of the second chip.

Embodiments of the present invention will be explained with reference to the accompanying drawings. With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

Figure 1A:
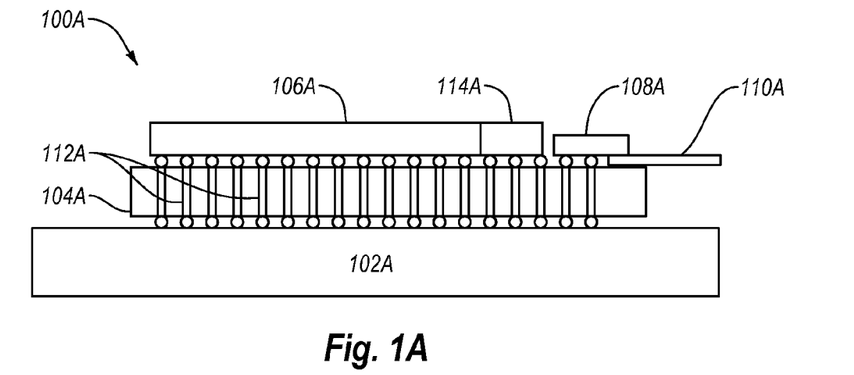
FIGS. 1A-1C illustrate various example IC chip packages.
Figure 1B:
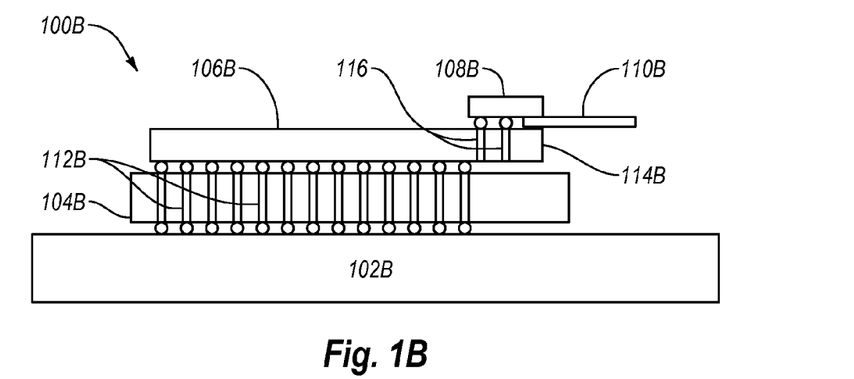
Figure 1C:
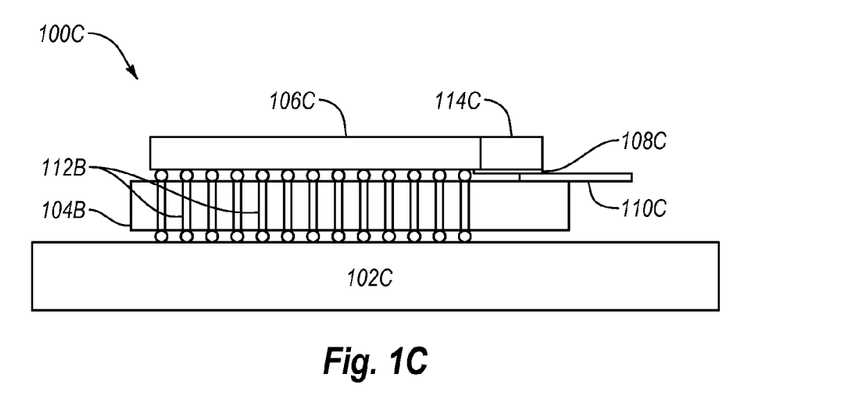

FIGS. 1A-1C illustrate various example IC chip packages 100A-100C (collectively "IC chip packages 100"). Each of the IC chip packages 100 includes a package substrate 102A-102C (collectively "package substrates 102"), an interposer 104A-104C (collectively "interposers 104"), a first chip 106A-106C (collectively "first chips 106"), a second chip 108A-108C (collectively "second chips 108"), and one or more fibers 110A-110C (collectively "fibers 110").

Each interposer 104 includes multiple conductive vias 112A-112C (collectively "conductive vias 112"), only some of which are labeled in FIGS. 1A-1C for simplicity. Some of the conductive vias 112 may electrically couple the first chip 106 to the package substrate 102. Others of the conductive vias 112 may electrically couple the first chip 106 to the second chip 108 and are examples of chip-to-chip interconnects.

The first chips 106 and the second chips 108 may be heterogeneous. For example, each of the first chips 106 may include a central processing unit (CPU) and each of the second chips 108 may include a photonic integrated circuit (PIC). Alternately or additionally, each of the first chips 106 may include a driver 114A-114C (collectively "drivers 114") configured to drive a corresponding one of the second chips 108.

In FIG. 1A, the first chip 106A and the second chip 108A have a planar arrangement, e.g., both are coupled to the same surface of the interposer 104A and next to each other. The chip-to-chip interconnects between the first chip 106A and the second chip 108A may include lateral interconnects, each of which may include a different set of two of the conductive vias 112 and a lateral trace in the package substrate 102 that collectively form an electrical path between the driver 114A and the second chip 108A. Such chip-to-chip interconnects may be relatively long and may negatively impact performance in applications involving high bandwidth data communications between the first chip 106A and the second chip 108A.

In FIG. 1B, the first chip 106B and the second chip 108B have a backside bonding arrangement, e.g., the second chip 108B is bonded to a backside of the first chip 106B. The chip-to-chip interconnects between the first chip 106B and the second chip 108B may include conductive vias 116 that pass through the first chip 106B and that connect an electrical interface on a front side of the first chip 106B to the second chip 108B. The chip-to-chip interconnects in FIG. 1B may be shorter than in FIG. 1A, which may result in a relative improvement in performance in applications involving high bandwidth data communications between the first chip 106B and the second chip 108B. However, the backside bonding of the second chip 108B to the first chip 106B may result in relatively strong thermal coupling between the two chips 106B and 108B such that heat generated by the first chip 106B during operation may adversely affect operation of the second chip 108B. In addition, mounting a heat sink to the backside of the first chip 106B for thermal management may be difficult in view of the location of the second chip 108B on the backside of the first chip 106B.

In FIG. 1C, the first chip 106C and the second chip 108C have a buildup arrangement, e.g., the second chip 108C is mounted to a front side of the first chip 106C between the first chip 106C and the interposer 104C. The chip-to-chip interconnects between the first chip 106C and the second chip 108C may include direct interconnects from an electrical interface on the front side of the first chip 106C to the second chip 108C. The chip-to-chip interconnects in FIG. 1C may be shorter than in FIG. 1B, which may again result in a relative improvement in performance in applications involving high bandwidth data communications between the first chip 106C and the second chip 108C. However, the thermal coupling between the first chip 106C and the second chip 108C in FIG. 1C may be even stronger than the thermal coupling between the first chip 106B and the second chip 108B in FIG. 1B, which may further negatively impact operation of the second chip 108C.

Figure 2A:
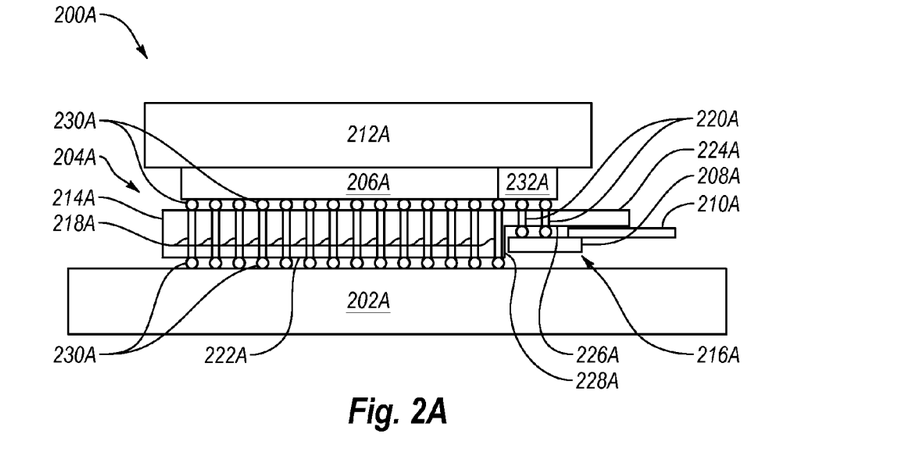
FIG. 2A illustrates a first example IC chip package, arranged in accordance with at least one embodiment described herein.
Figure 2B:
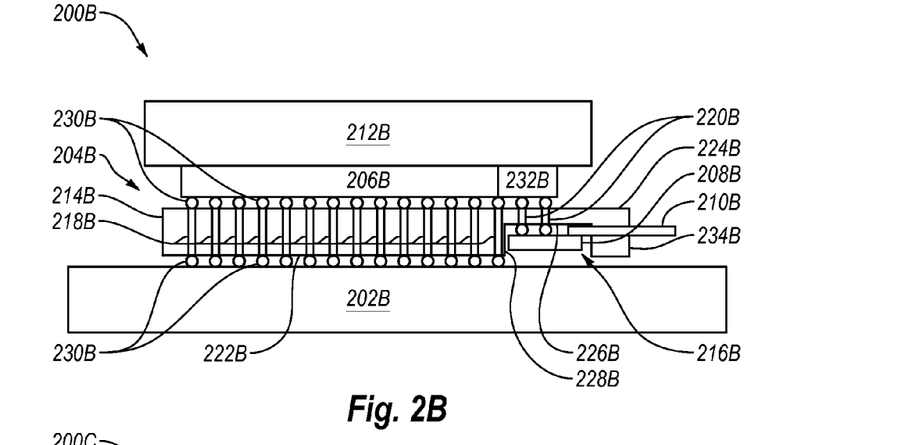
FIG. 2B illustrates a second example IC chip package, arranged in accordance with at least one embodiment described herein.
Figure 2C:
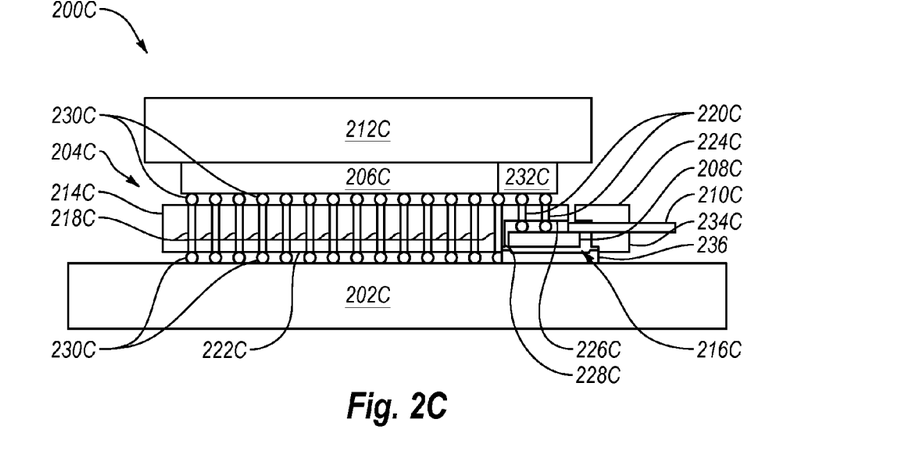
FIG. 2C illustrates a third example IC chip package, arranged in accordance with at least one embodiment described herein.

FIG. 2A illustrates a first example IC chip package 200A, arranged in accordance with at least one embodiment described herein. FIG. 2B illustrates a second example IC chip package 200B, arranged in accordance with at least one embodiment described herein. FIG. 2C illustrates a third example IC chip package 200C, arranged in accordance with at least one embodiment described herein. The first, second, and third IC chip packages 200A, 200B, and 200C may be referred to collectively as "IC chip packages 200."

Each of the IC chip packages 200 may include a package substrate 202A-202C (collectively "package substrates 202"), an interposer 204A-204C (collectively "interposers 204"), a first chip 206A-206C (collectively "first chips 206"), a second chip 208A-208C (collectively "second chips 208"), and one or more fibers 210A-210C (collectively "fibers 210"). Alternately or additionally, each of the IC chip packages 200 may further include a heat sink 212A-212C (collectively "heat sinks 212").

According to some embodiments, the interposers 204 in the IC chip packages 200 may enable relatively shorter chip-to-chip interconnects and/or greater thermal resistance between the first chips 206 and the second chips 208 as compared to the IC chip packages 100 of FIGS. 1A-1C. The first chips 206 and the second chips 208 may be heterogeneous chips.

In these and other embodiments, each of the interposers 204 may include a substrate 214A-214C (collectively "substrates 214"), a recess 216A-216C (collectively "recesses 216") formed in the substrate 214, first conductive vias 218A-218C (collectively "first conductive vias 218"), and second conductive vias 220A-220C (collectively "second conductive vias 220").

Each of the substrates 214 may include metal, dielectric, semiconductor such as silicon, or other suitable substrate material. Alternately or additionally, each of the substrates 214 may include a first surface 222A-222C (collectively "first surfaces 222"), a second surface 224A-224C (collectively "second surfaces 224"), a third surface 226A-226C (collectively "third surfaces 226"), and an orthogonal surface 228A-228C (collectively "orthogonal surfaces 228"). Each second surface 224 may be substantially parallel to and opposite the corresponding first surface 222. Each third surface 226 may be substantially parallel to both the corresponding first surface 222 and the corresponding second surface 224. Each orthogonal surface 228 may be substantially orthogonal to and may intersect the corresponding first surface 222 and the corresponding third surface 226.

Each recess 216 may be defined by the corresponding third surface 226 and the corresponding orthogonal surface 228. For example, each recess 216 may be at least partially bounded by the corresponding third surface 226 and the corresponding orthogonal surface 228. Although not illustrated, each substrate 214 may further include one or more other surfaces that are substantially orthogonal to and intersect the corresponding third surface 226 and the corresponding first surface 222 and that further bound the corresponding recess 216.

The first conductive vias 218 of each interposer 204 may pass through the corresponding substrate 214 from the corresponding second surface 224 to the corresponding first surface 222. The second conductive vias 220 of each interposer 204 may pass through the corresponding substrate 214 from the corresponding second surface 224 to the corresponding third surface 226.

Each first surface 222 may be coupled to the corresponding package substrate 202. For example, couplers 230A-230C (collectively "couplers 230," only some of which are labeled) may electrically and/or mechanically couple the first surface 222 to the package substrate 202 by electrically and/or mechanically coupling portions of the first conductive vias 218 that extend to the first surface 222 (or to bond pads of the first conductive vias 218 on the first surface 222) to bond pads and/or traces (not shown) in the package substrate 202. The couplers 230 may include, for instance, solder bonds or conductive adhesive.

Each first chip 206 may be mounted to the corresponding second surface 224 of the corresponding substrate 214. For example, the first chip 206 may be mounted to the second surface 224 with couplers 230 that electrically and/or mechanically couple bond pads and/or traces on a front side of the first chip 206 to portions of the first conductive vias 218 and/or second conductive vias 220 that extend to the second surface 224 (or to bond pads of the first conductive vias 218 and/or second conductive vias 220 that are on the second surface 224). Accordingly, the first conductive vias 218, together with couplers 230, may electrically couple the first chip 206 to the package substrate 202 through the substrate 214. Each first chip 206 may include a logic chip including, but not limited to, a central processing unit (CPU), an input/output (I/O) chip, or other suitable logic chip.

Each second chip 208 may be mounted in the corresponding recess 216 to the corresponding third surface 226 that faces the corresponding package substrate 202. For example, the second chip 208 may be mounted to the third surface 226 with couplers 230 that electrically and/or mechanically couple bond pads and/or traces on a corresponding side of the second chip 208 to portions of the second conductive vias 220 that extend to the third surface 226 (or to bond pads of the second conductive vias 220 that are on the third surface 226). Accordingly, the second conductive vias 220, together with couplers 230, may electrically couple the first chip 206 to the second chip 208 through the substrate 214. More particularly, the second conductive vias 220 may electrically couple a driver 232A-232C (collectively "drivers 232") to the corresponding second chip 208, which may be configured to drive the corresponding second chip 208. Each second chip 208 may include a PIC, a microelectromechanical systems (MEMS) chip, one or more sensors, or other suitable chip.

Each heat sink 212 may be coupled to a backside of the corresponding first chip 206. The backside of each first chip 206 is the top side in the views of FIGS. 2A-2C. In contrast to the backside bonding arrangement of FIG. 1B in which it may be difficult to mount a heat sink to the first chip 106B in view of the position of the second chip 108B, it may be relatively straightforward to mount the heat sinks 212 to the backsides of the first chips 206 since the second chips 208 are not mounted to the backsides of the first chips 206.

The fibers 210 may be communicatively coupled to the corresponding second chip 208 and may extend out of the corresponding recess 216. Each of the fibers 210 may include an optical fiber. The fibers 210 are examples of elongate transmission media that may be included in the IC packages 200 for off-chip communications from the second chips 208 to other chips or devices. More generally, the IC packages 200 may include elongate transmission media communicatively coupled to the second chips 208 that extend out of the recesses 216, where the elongate transmission media may include the fibers 210, electrical transmission media such as wires, or other suitable elongate transmission media. The fibers 210 may be discussed in some examples that follow with the understanding that the fibers 210 may more generally include any suitable elongate transmission media.

The interposer 204B of FIG. 2B may further include a side piece 234B. The side piece 234B may define a side of the recess 216B that is opposite the orthogonal surface 228B. The side piece 234B may define multiple through channels, each configured to receive one of the fibers 210B extending from the second chip 208B out of the recess 216B through a corresponding one of the through channels in a direction substantially parallel to the third surface 226B.

Figure 3:
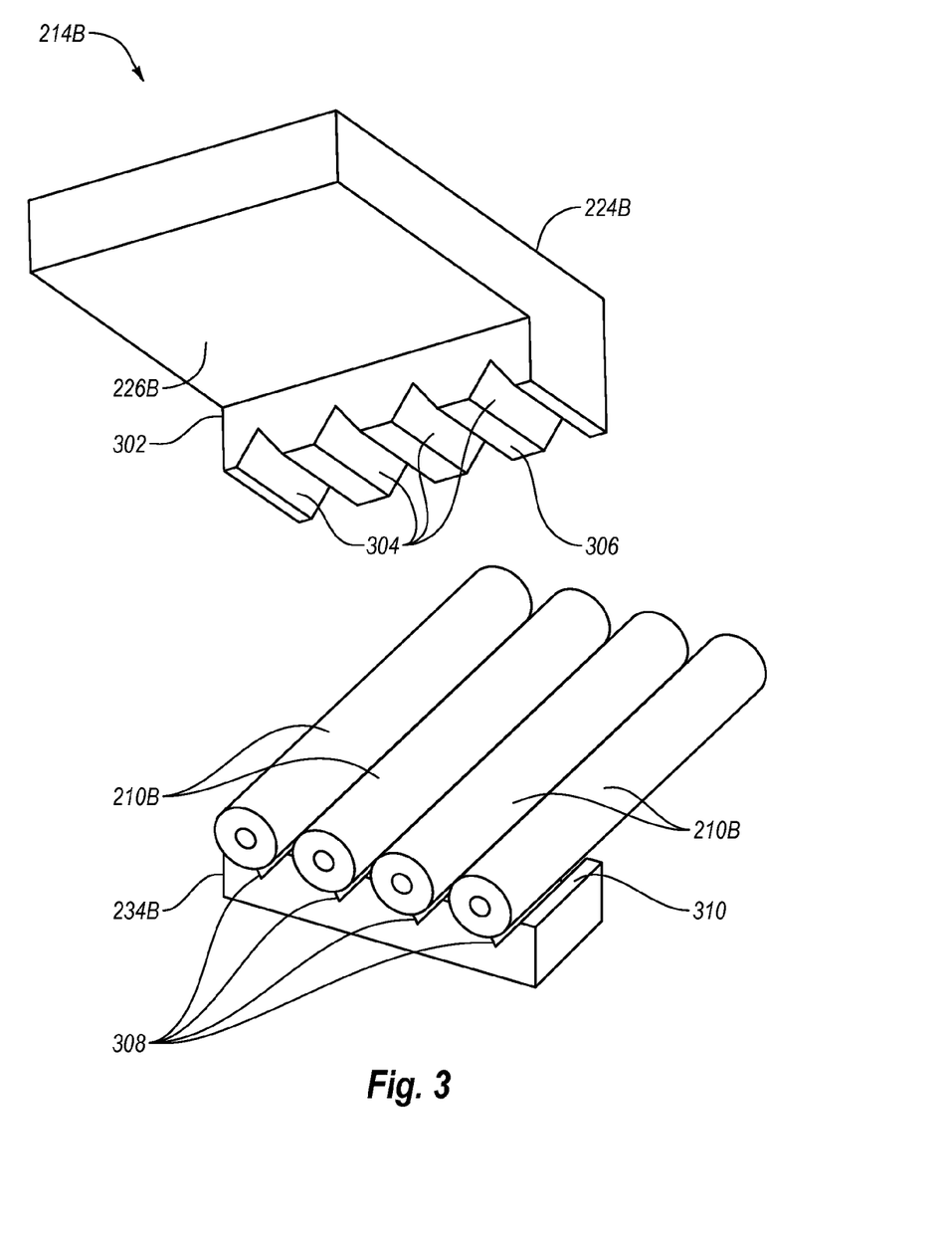
FIG. 3 is an exploded view of an example of a side piece and a portion of a substrate that may be included in the IC chip package of FIG. 2B, arranged in accordance with at least one embodiment described herein.

FIG. 3 is an exploded view of an example of the side piece 234B and a portion of the substrate 214B of FIG. 2B, arranged in accordance with at least one embodiment described herein. The relative orientation between the side piece 234B and the portion of the substrate 214B illustrated in FIG. 3 is different than in FIG. 2B for illustration purposes. As illustrated in FIG. 3, the substrate 214B may include an extension 302 extending from the third surface 226B in a direction away from the second surface 224B. The extension 302 may cooperate with the side piece 234B to define the through channels and to define the side of the recess 216B that is opposite the orthogonal surface 228B as illustrated in FIG. 2B.

In more detail, the extension 302 may include first notches 304 formed in a surface 306 of the extension 302 that faces the side piece 234B. The side piece 234B may include second notches 308 formed in a surface 310 of the side piece 234B that faces the extension 302. When assembled, the first notches 304 in the extension 302 and the second notches 308 in the side piece 234B may form the through channels through which the fibers 210B may extend out of the recess 216B of FIG. 2B. Although four first notches 304, four second notches 308, and thus four through channels are illustrated and/or described, more generally there may be any suitable number, including more or fewer than four first notches 304, second notches 308, and/or through channels.

Referring to FIG. 2C, the interposer 204C may further include a side piece 234C with a similar arrangement and function as the side piece 234B of FIGS. 2B and 3. Alternately or additionally, the interposer 204C may further include a baffle plate 236. The baffle plate 236 may cooperate with the substrate 214C and the side piece 234C to enclose the second chip 208C within the recess 216C. Accordingly, the substrate 214C, the side piece 234C, and the baffle plate 236 may collectively form an enclosure for the recess 216C. The fibers 210C may extend out of the recess 216C through the enclosure in a direction substantially parallel to the third surface 226C.

Figure 4:
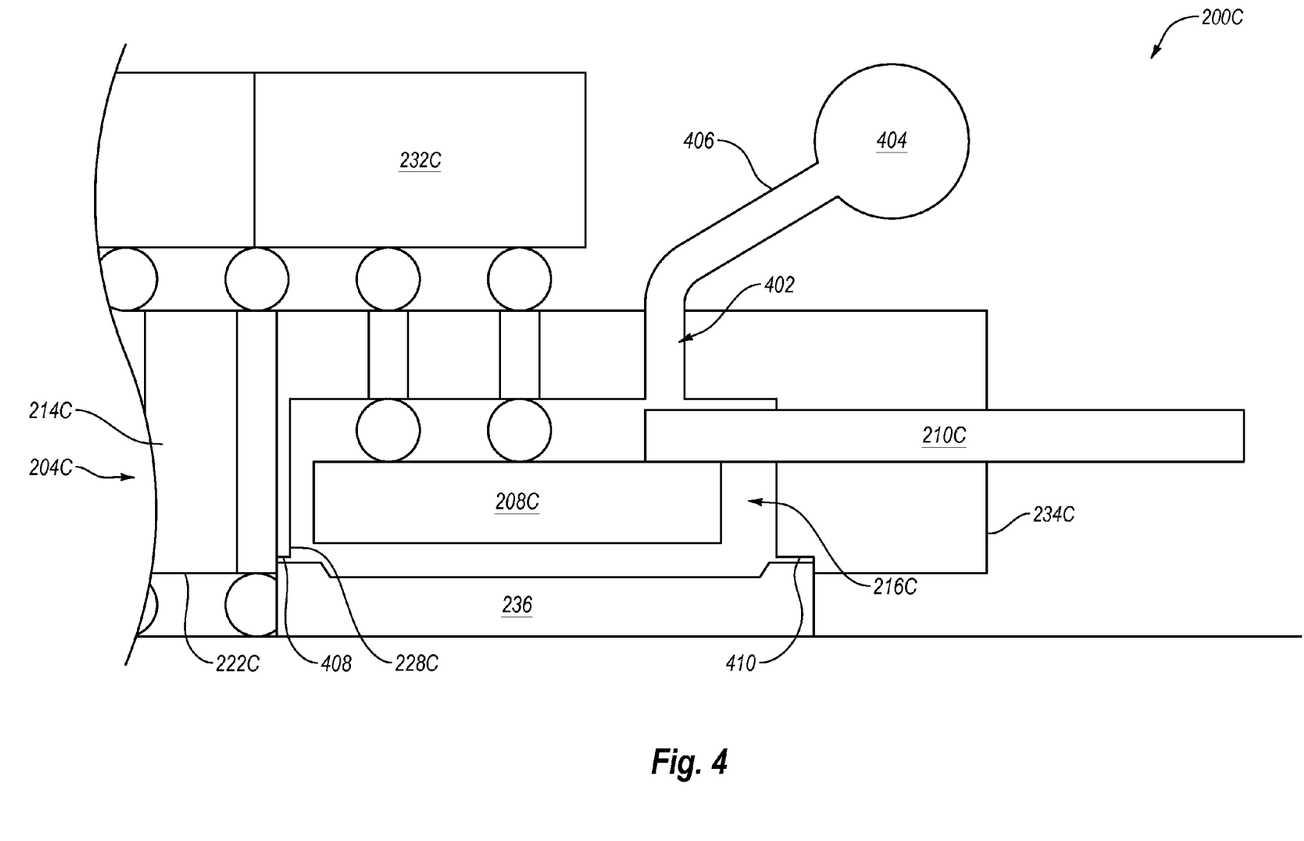
FIG. 4 is a detail view of a portion of the IC chip package of FIG. 2C, arranged in accordance with at least one embodiment described herein.

FIG. 4 is a detail view of a portion of the IC chip package 200C of FIG. 2C, arranged in accordance with at least one embodiment described herein. Reference numbers for some of the components and features illustrated in FIG. 2C have been omitted for clarity in FIG. 4. In general, the interposer 204C may define at least one fluid channel 402 that passes through the enclosure to the recess 216C. In FIG. 4, the fluid channel 402 is illustrated as passing through the substrate 2124C. More generally, each fluid channel may pass through at least one of the substrate 214C, the side piece 234C, and the baffle plate 236.

Although not illustrated in FIG. 2C, as illustrated in FIG. 4, the IC chip package 200C may further include a fluid reservoir 404 and a fluid guide 406. The fluid guide 406 may be coupled between the fluid channel 402 and the fluid reservoir 404. The fluid guide 406 may be configured to carry fluid between the fluid reservoir 404 and the recess 216C. For instance, the fluid guide 406 may be configured to carry fluid from the fluid reservoir 404 to the recess 216C as well as from the recess 216C to the fluid reservoir 404.

Alternately, one or more other fluid channels may be formed through the enclosure of the recess 216C and may be coupled to the fluid reservoir 404 via one or more other fluid guides. In these and other embodiments, the fluid guide 406 may be configured to carry fluid from the fluid reservoir 404 to the recess 216C or from the recess 216C to the fluid reservoir 404, while the one or more other fluid guides may be configured to carry fluid in the opposite direction.

Fluid carried by the fluid guide 406 between the recess 216C and the fluid reservoir 404 may be circulated around the second chip 208C for thermal management, e.g., to transfer thermal energy away from the second chip 208C and/or to maintain the second chip 208C within a desired temperature range.

As further illustrated in FIG. 4, a first ledge 408 may be formed in the substrate 214C where the orthogonal surface 228C and the first surface 222C intersect. A second ledge 410 may be formed in the side piece 234C. The first ledge 408 and the second ledge 410 may define a baffle plate seat. The first and second ledges 408 and 410 correspond to two sides of the recess 216C. Other sides of the recess 216C not visible in the plane of FIG. 4, e.g., two other sides when the recess 216C is substantially rectangular, may have corresponding ledges formed therein that cooperate with the first and second ledges 408 and 410 to define the baffle plate seat. The baffle plate 236 may be mounted in the baffle plate seat to form a hermetic or non-hermetic enclosure in cooperation with the substrate 214C and the side piece 234C.

Figure 5:
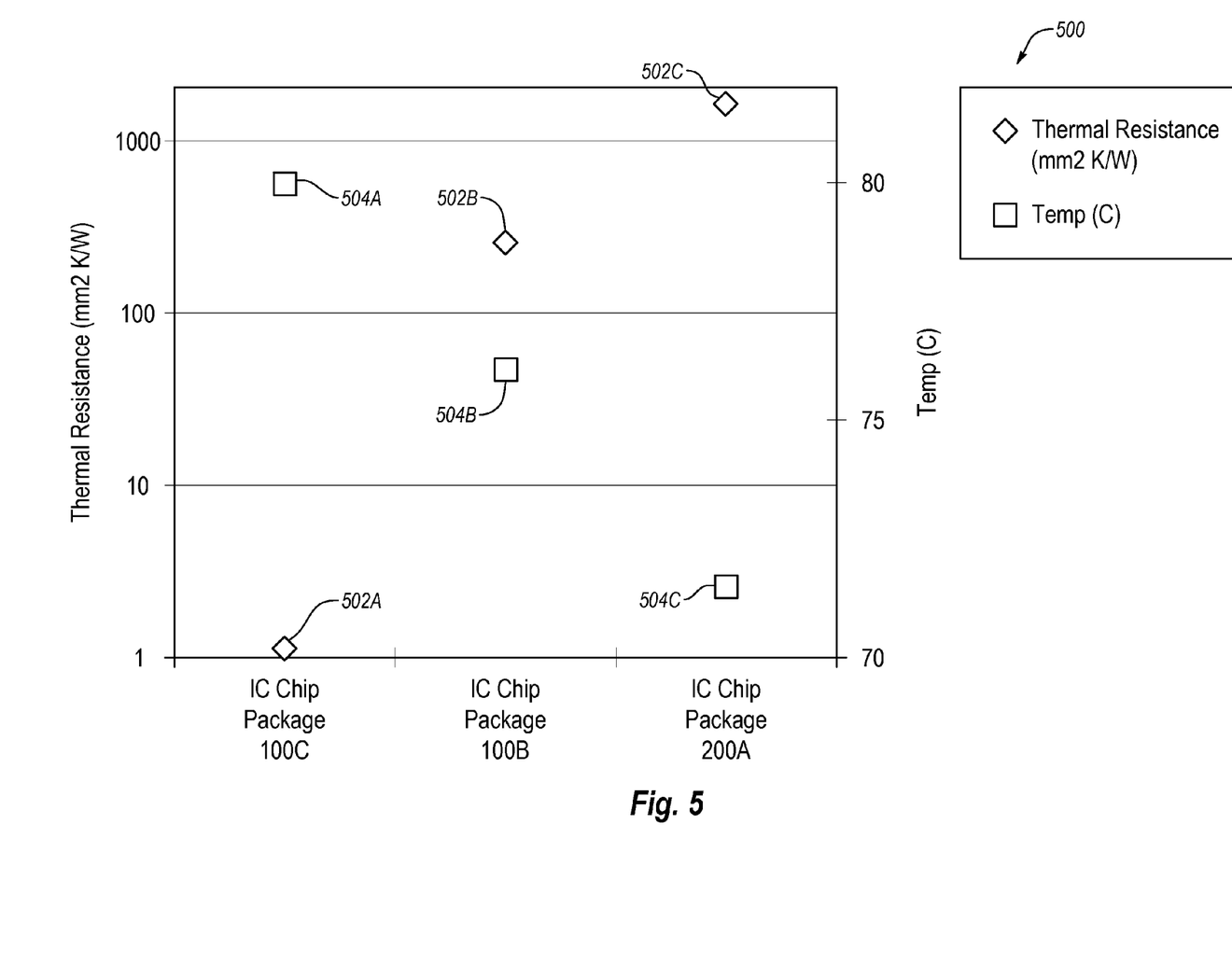
FIG. 5 is a chart illustrating simulated thermal resistance for the IC chip packages of FIGS. 1B, 1C, and 2A.

FIG. 5 is a chart 500 illustrating simulated thermal resistance for the IC chip packages 100B, 100C, and 200A of FIGS. 1B, 1C, and 2A. In FIG. 5, the left vertical axis corresponds to thermal resistance in units of millimeters squared kelvin per watt ($mm^2$ K/W). The right vertical axis corresponds to temperature in degrees Celsius. Each of the IC chip packages 100B, 100C, and 200A are listed along the horizontal axis.

With combined reference to FIGS. 1B, 1C, 2A, and FIG. 5, the simulation of FIG. 5 involves a 10° C. change in temperature from 70° C. to 80° C. in one second in the first chip 106B, 106C, and 206A. Two data points 502A and 504A, 502B and 504B, and 502C and 504C, are respectively provided for each of the IC chip packages 100B, 100C, and 200A, where the two data points represent thermal resistance and temperature.

In more detail, under the foregoing conditions, the data point 502A represents a resistance of the IC chip package 100C to thermal heat transfer from the first chip 106C to the second chip 108C, while the data point 504A represents the temperature of the second chip 108C after the 10° C. change in temperature in one second of the first chip 106C. Analogously, the data point 502B represents a resistance of the IC chip package 100B to thermal heat transfer from the first chip 106B to the second chip 108B, while the data point 504B represents the temperature of the second chip 108B after the 10° C. change in temperature in one second of the first chip 106B. Analogously, the data point 502C represents a resistance of the IC chip package 200A to thermal heat transfer from the first chip 206A to the second chip 208A, while the data point 504C represents the temperature of the second chip 208A after the 10° C. change in temperature in one second of the first chip 206A.

As illustrated in FIG. 5, the thermal performance of the IC chip package 200A is improved compared to the IC chip packages 100B and 100C of FIGS. 1B and 1C in which the second chip 208A is less thermally affected by the first chip 206A than in the IC chip packages 100B and 100C. A simulation was not performed with respect to the IC chip package 100A of FIG. 1A since the relatively long chip-to-chip interconnects used in the IC chip package 100A may render it unsuitable for high bandwidth data communications. Although not illustrated in FIG. 5, the IC chip packages 200B and 200C of FIGS. 2B and 2C may have a similar thermal performance as the IC chip package 200A of FIG. 2A. Alternately or additionally, in some embodiments, the IC chip package 200 of FIG. 2C may have better thermal performance than the IC chip package 200A of FIG. 2A.

Figure 6:
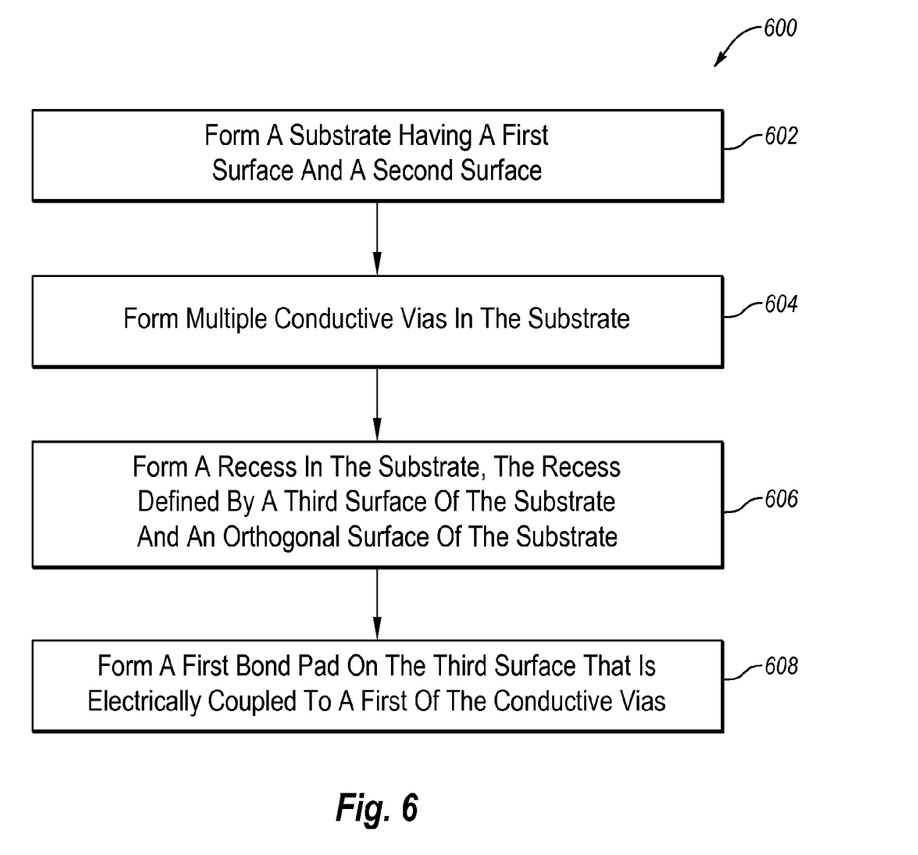
FIG. 6 shows an example flow diagram of a method of forming an interposer of an IC chip package, arranged in accordance with at least one embodiment described herein.

FIG. 6 shows an example flow diagram of a method 600 of forming an interposer of an IC chip package, arranged in accordance with at least one embodiment described herein. Although illustrated as discrete blocks, various blocks may be divided into additional blocks, combined into fewer blocks, or eliminated, depending on the desired implementation.

The method may begin at block 602 in which a substrate is formed having a first surface and a second surface. The second surface may be substantially parallel to and opposite the first surface. The substrate may be formed by any suitable process, such as Czochralski growth. In some embodiments, the substrate may correspond to the substrate 214 of FIGS. 2A-2C.

In block 604, multiple conductive vias may be formed in the substrate. The conductive vias may include through silicon vias (TSVs) filled with a conductive material, TSVs with metallized optical fibers inserted therein, or any suitable conductive vias. The conductive vias may pass through the substrate from the first surface to the second surface. In some embodiments, the conductive vias formed in the substrate may correspond to the first and second conductive vias 218 and 220 of FIGS. 2A-2C.

In block 606, a recess may be formed in the substrate. The recess may be defined by a third surface of the substrate that is substantially parallel to the first surface and by an orthogonal surface that is substantially orthogonal to and intersects the first surface and the third surface. At least a first of the conductive vias may pass through the substrate from the second surface to the third surface of the substrate. In some embodiments, the recess formed in the substrate may correspond to the recess 216 of FIGS. 2A-2C.

The recess may be formed in the substrate by removing, from the first surface to the third surface, a portion of the substrate and a portion of the first of the conductive vias. The portion of the substrate and the portion of the first of the conductive vias may be removed substantially simultaneously or in sequence.

In block 608, a first bond pad may be formed on the third surface of the substrate. The first bond pad may be electrically coupled to the first of the conductive vias. In some embodiments, the first bond pad may be formed on the third surface by forming an electrically conductive layer on the second surface that is electrically coupled to the first of the conductive vias; placing the substrate and electrically conductive layer in an electrolyte bath; applying an electric current to the electrically conductive layer; and depositing the first bond pad on the third surface such that the first bond pad is electrically coupled to the first of the conductive vias.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

For example, the method 600 may be combined with or included in a method of forming an IC chip package, such as the IC chip packages 200 of FIGS. 2A-2C. The method of forming the IC chip package may further include mounting a first chip, such as the first chip 206 of FIGS. 2A-2C, to the second surface of the substrate. A second chip, such as the second chip 208 of FIGS. 2A-2C, may be mounted to the third surface of the substrate within the recess. The first surface of the substrate may be coupled to a package substrate of the IC chip package, such as the package substrate 202 of FIGS. 2A-2C. The conductive vias formed in the substrate may include first conductive vias and second conductive vias, where the second conductive vias include the first of the conductive vias to which the first bond pad is electrically coupled. The first conductive vias and the second conductive vias may respectively correspond to the first conductive vias 218 and the second conductive vias 220 of FIGS. 2A-2C. Thus, the IC chip package may be formed such that the second conductive vias electrically couple the first chip to the second chip and the first conductive vias electrically couple the first chip to the package substrate.

The recess formed in the substrate of the interposer may be further defined by an extension of the substrate, such as the extension 302 of FIG. 3. The method 600 of FIG. 6 and/or the method of forming the IC chip package may further include forming a side piece, such as the side pieces 234B and 234C of FIGS. 2B-3, that cooperates with the extension of the substrate to define a side of the recess that is opposite the orthogonal surface of the substrate. First notches may be formed in a surface of the extension that faces the side piece and second notches may be formed in a surface of the side piece that faces the extension. The first and second notices may correspond to the first and second notches 304 and 308 of FIG. 3 in some embodiments. Elongate transmission media, such as the fibers 210B and 210C of FIGS. 2B-3, may be communicatively coupled to the second chip, the elongate transmission media extending out of the recess in a direction substantially parallel to the third surface of the substrate. The side piece may be secured relative to the extension such that the first notches and the second notches form through channels through which the elongate transmission media extend out of the recess.

Alternately or additionally, the method 600 of FIG. 6 and/or the method of forming the IC chip package may further include forming a baffle plate, such as the baffle plate 236 of FIGS. 2C and 4. A first ledge, such as the first ledge 408 of FIG. 4, may be formed in the substrate where the orthogonal surface and the first surface intersect. A second ledge, such as the second ledge 410, may be formed in the side piece, where the first ledge and the second ledge define a baffle plate seat. The baffle plate may be mounted in the baffle plate seat, where the baffle plate, the substrate, and the side piece cooperate to enclose the second chip of the IC chip package within the recess.

Alternately or additionally, the method 600 of FIG. 6 and/or the method of forming the IC chip package may further include forming a fluid channel, such as the fluid channel 402 of FIG. 4, through at least one of the substrate, the side piece, and the baffle plate. A fluid guide, such as the fluid guide 406 of FIG. 4, may be coupled to the fluid channel. The fluid guide may be configured to carry fluid to the recess, from the recess, or both to the recess and from the recess through the fluid channel.

Figure 7:
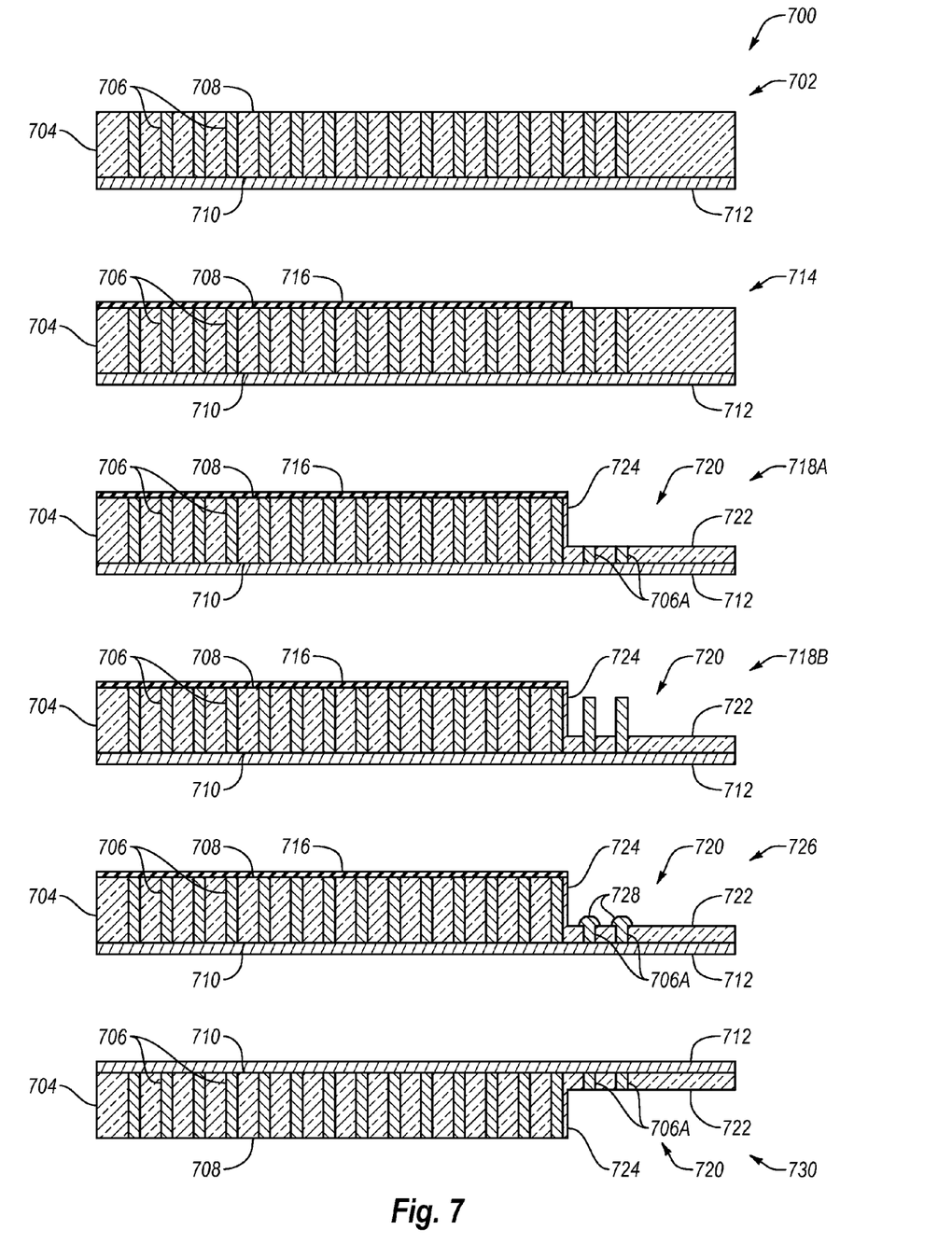
FIG. 7 shows an example interposer at various stages of processing according to the method of FIG. 6, arranged in accordance with at least one embodiment described herein.

FIG. 7 shows an example interposer 700 at various stages of processing according to the method 600 of FIG. 6, arranged in accordance with at least one embodiment described herein. Stage 702 illustrates a substrate 704 including conductive vias 706 (only some of which are labeled) formed therein. The substrate 704 includes a first surface 708 and a second surface 710 that is substantially parallel to and opposite the first surface 708.

An electrically conductive layer 712 is formed on the second surface 710 electrically coupled to each of the conductive vias 706. The electrically conductive layer 712 may be used in the formation of bond pads as already described with respect to FIG. 6.

Stage 714 illustrates a protective layer 716 formed on the first surface 708 of the substrate 704. The protective layer 716 may include a polymer layer or other suitable sacrificial layer.

Stage 718A illustrates the substrate 704 with a recess 720 formed therein by a plasma etch or other suitable fabrication process that simultaneously removes portions of the substrate 704 and portions of the conductive vias 706 not covered by the protective layer 716. The portions may be removed by etching from the first surface 708 down a selected depth. A third surface 722 formed at the selected depth together with an orthogonal surface 724 formed by etching may define the recess 720. Conductive vias 706 that are partially removed and shortened as illustrated in, e.g., stage 718A, may be referred to hereinafter as second conductive vias 706A and may correspond to the second conductive vias discussed previously. Stage 718A of FIG. 7 may result after forming a recess in a substrate as described with respect to block 606 of FIG. 6.

Stage 718B illustrates an alternative to the process described with respect to stage 718A. In stage 718B, the recess 720 is partially formed as portions of the conductive vias 706 not covered by the protective layer 716 have not been removed simultaneously with the removal of the portion of the substrate 704 not covered by the protective layer 716, or at least have not been completely removed down to the third surface 722. Stage 718B may result when the etch or other removal process used to remove the portion of the substrate 704 does not etch the material of the substrate 704 at the same rate as the material of the conductive vias 706. The first etch to remove the portion of the substrate 704 may be followed by a second etch or other removal process that may selectively remove the portions of the conductive vias 706 not covered by the protective layer 716 down to the third surface 722 without further removing any more of the substrate 704 not covered by the protective layer 716. After removing the portions of the conductive vias 706 not covered by the protective layer 716 down to the third surface 722, the resulting interposer 700 may have the same configuration as illustrated in stage 718A.

Stage 726 illustrates bond pads 728 formed on the third surface 722, each of which is electrically coupled to a corresponding one of the second conductive vias 706A. The bond pads 728 may be formed by placing the substrate 704 with the electrically conductive layer 712 in an electrolyte bath, applying an electric current to the electrically conductive layer, and depositing the bond pads 728 on the third surface in electrical contact with the second conductive vias 706A. Alternately or additionally, bond pads 728 may be formed on the first surface 708 electrically coupled to the remaining conductive vias 706 by removing the protective layer 716 prior to placing the substrate 704 with the electrically conductive layer 712 in the electrolyte bath. Stage 726 may result from forming a first bond pad or pads on a third surface of a substrate as generally described above with respect to block 608 of FIG. 6.

Stage 730 illustrates the interposer 700 after being flipped upside down compared to the orientation of the interposer 700 in stages 702, 714, 718A, 718B, and 726 and after removal of the protective layer 716. The orientation of the interposer 700 in stage 730 corresponds to the orientation of the interposer 204 in FIGS. 2A-2C. In stage 730, the second conductive vias 706A are also illustrated without the bond pads 728 of stage 726. Interposers according to embodiments described herein may be implemented in IC chip packages with or without bond pads electrically coupled to the conductive vias of the interposers.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present inventions have been described in detail, it should be understood that the various changes, substitutions, and alterations could be made hereto without departing from the spirit and scope of the invention.

What is claimed is:

1. An interposer for an electronic circuit chip package, the interposer comprising:
    a substrate having a first surface, a second surface substantially parallel to and opposite the first surface, a third surface substantially parallel to the first surface and the second surface, and an orthogonal surface that is substantially orthogonal to and intersects the first surface and the third surface;
    a recess formed in the substrate and defined by the third surface and the orthogonal surface;
    a first plurality of conductive vias that pass from the second surface to the first surface; and
    a second plurality of conductive vias that pass from the second surface to the third surface;
    wherein:
        the first plurality of conductive vias is configured to electrically couple a first chip mounted to the second surface to a package substrate coupled to the first surface;
        the second plurality of conductive vias is configured to electrically couple the first chip mounted to the second surface to a second chip mounted to the third surface within the recess;
        the first chip and the second chip are vertically displaced from each other but not laterally displaced from each other; and
        a resistance of the electronic circuit chip package to thermal heat transfer from the first chip through the interposer to the vertically displaced but not laterally displaced second chip is greater than 1000 millimeters squared Kelvin per watt.

2. The interposer of claim 1, wherein the substrate comprises a metal, a dielectric, or a semiconductor.

3. The interposer of claim 1, further comprising a side piece defining a side of the recess that is opposite the orthogonal surface, wherein the side piece defines a plurality of through channels, each configured to receive an elongate transmission medium extending from the second chip out of the recess through a corresponding one of the plurality of through channels in a direction substantially parallel to the third surface.

4. The interposer of claim 3, wherein the substrate further includes an extension extending from the third surface in a direction away from the second surface, the extension cooperating with the side piece to define the through channels.

5. The interposer of claim 3, further comprising a baffle plate configured to cooperate with the substrate and the side piece to enclose the second chip within the recess.

6. An electronic circuit chip package comprising:
    a package substrate;
    an interposer including a substrate having a first surface and a second surface substantially parallel to and opposite the first surface, wherein the first surface is coupled to the package substrate;
    a first chip mounted to the second surface of the substrate, the substrate including a first plurality of conductive vias that electrically couple the first chip mounted to the second surface to the package substrate coupled to the first surface;
    a second chip mounted in a recess to a third surface of the substrate that faces the package substrate, the recess defined by the third surface that is substantially parallel to the first surface and by an orthogonal surface of the substrate that is substantially orthogonal to and intersects the first surface and the third surface, the substrate including a second plurality of conductive vias that electrically couple the first chip mounted to the first surface to the second chip mounted to the third surface, wherein the recess is enclosed by an enclosure made at least partially of the substrate and wherein the interposer defines at least one fluid channel that passes through the substrate;
    a fluid reservoir;
    a fluid guide directly coupled to and between the at least one fluid channel and the fluid reservoir; and
    a fluid disposed in the fluid reservoir, the fluid guide, the fluid channel, and in the enclosure surrounding the second chip,
    wherein the fluid guide is configured to carry the fluid between the fluid reservoir and the recess through the at least one fluid channel and the fluid is configured to be circulated around the second chip to thermally manage the second chip during operation of the second chip.

7. The electronic circuit chip package of claim 6, wherein the first chip comprises a central processing unit (CPU) and the second chip comprises a photonic integrated circuit (PIC).

8. The electronic circuit chip package of claim 6, further comprising a heat sink coupled to a backside of the first chip that is substantially parallel to and opposite a front side of the first chip, the front side of the first chip coupled to the second surface of the substrate of the interposer.

9. The electronic circuit chip package of claim 6, wherein the second plurality of conductive vias electrically couple a driver of the first chip to the second chip.

10. The electronic circuit chip package of claim 6, further comprising a plurality of elongate transmission media communicatively coupled to the second chip and extending out of the recess through the enclosure in a direction substantially parallel to the third surface.

11. The electronic circuit chip package of claim 6, wherein a resistance of the electronic circuit chip package to thermal heat transfer from the first chip through the interposer to the second chip is greater than 1000 millimeters squared Kelvin per watt.

12. The electronic chip package of claim 6, wherein:
    the first chip and the second chip are vertically displaced from each other but not laterally displaced from each other; and
    a resistance of the electronic circuit chip package to thermal heat transfer from the first chip through the interposer to the vertically displaced but not laterally displaced second chip is greater than 1000 millimeters squared Kelvin per watt.

* * * * *